(12) United States Patent
Byrd et al.

(10) Patent No.: US 11,714,117 B2
(45) Date of Patent: Aug. 1, 2023

(54) AUTOMATED METHOD TO CHECK ELECTROSTATIC DISCHARGE EFFECT ON A VICTIM DEVICE

(71) Applicant: Synopsys, Inc., Mountain View, CA (US)

(72) Inventors: Jeffrey Ellis Byrd, Greensboro, NC (US); Peter C. de Jong, Oosterbeek (NL); Herman Luijmes, Didam (NL)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 17/532,550

(22) Filed: Nov. 22, 2021

(65) Prior Publication Data
US 2022/0163580 A1 May 26, 2022

Related U.S. Application Data

(60) Provisional application No. 63/116,647, filed on Nov. 20, 2020.

(51) Int. Cl.
| | | |
|---|---|---|
| *G01R 1/06* | (2006.01) | |
| *G01R 31/00* | (2006.01) | |
| *G01R 27/18* | (2006.01) | |
| *G01R 1/067* | (2006.01) | |
| *G01R 19/155* | (2006.01) | |
| *G01N 27/07* | (2006.01) | |

(Continued)

(52) U.S. Cl.
CPC ....... *G01R 31/002* (2013.01); *G01R 1/06722* (2013.01); *G01R 1/06788* (2013.01); *G01R 19/155* (2013.01); *G01R 27/18* (2013.01); *G01N 15/0656* (2013.01); *G01N 27/02* (2013.01); *G01N 27/07* (2013.01)

(58) Field of Classification Search
CPC ...... G01R 31/002; G01R 27/18; G01R 31/14; G01R 29/12; G01R 1/06788; G01R 19/155; G01R 1/06772; H02H 9/041; G01N 27/07; G01N 27/02; G01N 15/0656
USPC ................... 324/72, 76.11–76.83, 119, 149
See application file for complete search history.

(56) References Cited

U.S. PATENT DOCUMENTS

| | | | |
|---|---|---|---|
| 2014/0033519 A1* | 2/2014 | Abou-Khalil | H01L 21/76898 29/745 |
| 2015/0098161 A1* | 4/2015 | Horowy | H02H 9/02 361/87 |

(Continued)

*Primary Examiner* — Raul J Rios Russo
(74) *Attorney, Agent, or Firm* — Lowenstein Sandler LLP

(57) ABSTRACT

Some aspects of this disclosure are directed to an automated method to check electrostatic discharge (ESD) effect on a victim device. For example, some aspects of this disclosure relate to a method, including determining a probe point, in a circuit design, for determining effective resistance between the probe point and ground, where the probe point is on an ESD path of in the circuit design. The method includes determining voltage between the probe point and the ground. The method further includes comparing, by a processing device, a resistance value of the ESD path determined based a predefined electric current value at a source point and the measured voltage with a target resistance value range. The method further includes reporting a violation upon determining that the determined resistance value of the ESD path is outside the target resistance value range.

20 Claims, 5 Drawing Sheets

(51) Int. Cl.
    *G01N 27/02* (2006.01)
    *G01N 15/06* (2006.01)

(56) References Cited

U.S. PATENT DOCUMENTS

2016/0105946 A1* 4/2016 Newman ................ H05F 3/025
                                                    361/220
2018/0218101 A1* 8/2018 Srinivasan ............ G06F 30/367
2019/0354654 A1* 11/2019 Srinivasan .............. G06F 30/39

* cited by examiner

AUTOMATED METHOD TO CHECK ELECTROSTATIC DISCHARGE EFFECT ON A VICTIM DEVICE

RELATED APPLICATION

This application claims the benefit of U.S. Provisional Patent Appl. No. 63/116,647 filed Nov. 20, 2020, and entitled "AN AUTOMATED METHOD TO CHECK ELECTROSTATIC DISCHARGE EFFECT ON A VICTIM DEVICE," and is incorporated herein in its entirety.

TECHNICAL FIELD

The present disclosure relates to the field of electronic design automation and tools. More specifically, the present disclosure is related to an automated method to check electrostatic discharge effect on a victim device.

BACKGROUND

Integrated circuits (ICs) are designed to operate on a few volts up to tens of volts. However, during an electrostatic discharge (ESD) event, devices in an IC can experience hundreds of volts across their pins, resulting in a catastrophic failure and breakdown of the victim devices. ESD protection circuitry is added to the ICs to prevent high voltages from damaging the internal devices. The ESD protection circuitry directs the high currents associated with an ESD event along paths designed to handle these high currents, thereby limiting or clamping the voltages that might damage the devices in an IC.

ESD protection verification tools are used to ensure that ICs have enough ESD protection to prevent damage to the internal devices. To evaluate effectiveness of an ESD protection schemes, ESD protection verification tools measure effective resistance between endpoints of an ESD path and compare the effective resistance to foundry-specified rules.

SUMMARY

Some aspects of this disclosure relate to a method for implementing an automated method to check electrostatic discharge effect on a victim device. For example, some aspects of this disclosure include determining a probe point, in a circuit design, for determining effective resistance between the probe point and ground. The probe point is on an electrostatic discharge (ESD) path in the circuit design. According to some aspects, the method includes determining the voltage between the probe point and the ground. According to some aspects, the method further includes comparing, by a processing device, a resistance value of the ESD path determined based on a predefined electric current value at a source point and the measured voltage, with a target resistance value range According to some aspects, the method further includes reporting a violation upon determining that the determined resistance value of the ESD path is outside the target resistance value range.

Some aspects of this disclosure relate to the method that further includes determining voltage between the source point and the ground, identifying a portion of a discharge path that does not contribute to the voltage between the probe point and the ground, and subtracting voltage drop across the portion of the ESD path from the voltage between the source point and the ground. According to some aspects, determining the voltage between the probe point and the ground includes determining the voltage between a logical branch point and the ground where the probe point is connected to the logical branch point. According to some aspects, the current flowing from the logical point to the probe point is zero during an ESD event. According to some aspects, the target resistance value range is specified by a foundry rule. According to some aspects, the method further includes updating the resistance value in the ESD path to comply with a foundry rule. According to some aspects, the resistance value of the ESD path is calculated using Ohm's law.

Some aspects of this disclosure relate to a memory storing instructions, and a processor, coupled with the memory and to execute the instructions, and the instructions when executed cause the processor to determine a probe point, in a circuit design, for determining effective resistance between the probe point and ground, where the probe point is on an electrostatic discharge (ESD) path in the circuit design. According to some aspects, the instructions, when executed, further cause the processor to determine voltage between the probe point and the ground. According to some aspects, the instructions, when executed, further cause the processor to compare a resistance value of the ESD path, determined based a predefined electrical current value at a source point and the measured voltage, with a target resistance value range. According to some aspects, the instructions when executed, further cause the processor to report a violation upon determining that the determined resistance value of the ESD path is outside the target resistance value range.

According to some aspects, the instructions when executed, further cause the processor to determine voltage between the source point and the ground, identify a portion of a discharge path that does not contribute to the voltage between the probe point and the ground, and subtract voltage drop across the portion of the ESD path from the voltage between the source point and the ground. According to some aspects, the instructions when executed, further cause the processor to determine voltage between a logical branch point and the ground, wherein the probe point is connected to the logical branch point. According to some aspects, the current flowing from the logical branch point to the probe point is zero during an ESD event. According to some aspects, the target resistance value range is specified by a foundry rule. According to some aspects, the instructions when executed, further cause the processor to update the resistance value in the ESD path to comply with a foundry rule. According to some aspects, the resistance value of the ESD path is calculated using Ohm's law.

Some aspects of this disclosure relate to a non-transitory computer-readable medium having stored instructions, which, when executed by a processor, cause the processor to perform operations that include determining a probe point, in a circuit design, for determining effective resistance between the probe point and ground, wherein the probe point is on an electrostatic discharge (ESD) path in the circuit design. According to some aspects, the operations include sourcing electrical current through a source point in the ESD path, and determining voltage between the probe point and the ground. According to some aspects, the operations further include comparing a resistance value of the ESD path, determined based on predefined electrical current value at a source point and the measured voltage, with a target resistance value range. According to some aspects, the operations further include reporting a violation upon determining that the determined resistance value of the ESD path is outside the target resistance value range.

According to some aspects, the operations performed by the processor further include determining voltage between the source point and the ground, identifying a portion of a discharge path that does not contribute to the voltage between the probe point and the ground; and subtracting voltage drop across the portion of the ESD path from the voltage between the source point and the ground. According to some aspects, the operations further include determining the voltage between the probe point and the ground further comprises determining voltage between a logical branch point and the ground, where the probe point is connected to the logical branch point. According to some aspects, current following from the logical point to the probe point is zero during an ESD event. According to some aspects, the target resistance value range is specified by a foundry rule. According to some aspects, the operations performed by the processor further include updating the resistance value in the ESD path to comply with a foundry rule.

This Summary does not attempt to provide the complete significance of any particular innovation, embodiment, or example as it can be used in commerce. Additionally, this Summary is not intended to signify key or critical elements of an innovation, embodiment or example or to limit the scope of the subject matter of this disclosure. The innovations, embodiments, and/or examples found within this disclosure are not all-inclusive, but rather describe the basic significance of the subject matter. Accordingly, one use of this Summary is as a prelude to a Detailed Description presented below.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

In the Figures, similar components or features may have the same, or similar, reference signs in the form of labels (such as alphanumeric symbols, e.g., reference numerals), and may signify similar or equivalent functionality. Further, various components of the same type may be distinguished by following the reference label by a dash and a second label that distinguishes similar components. If only the first reference label is used in the specification, the description applies to any similar components having the same first reference label irrespective of the second reference label. A brief description of the Figures is below.

Figure 1:
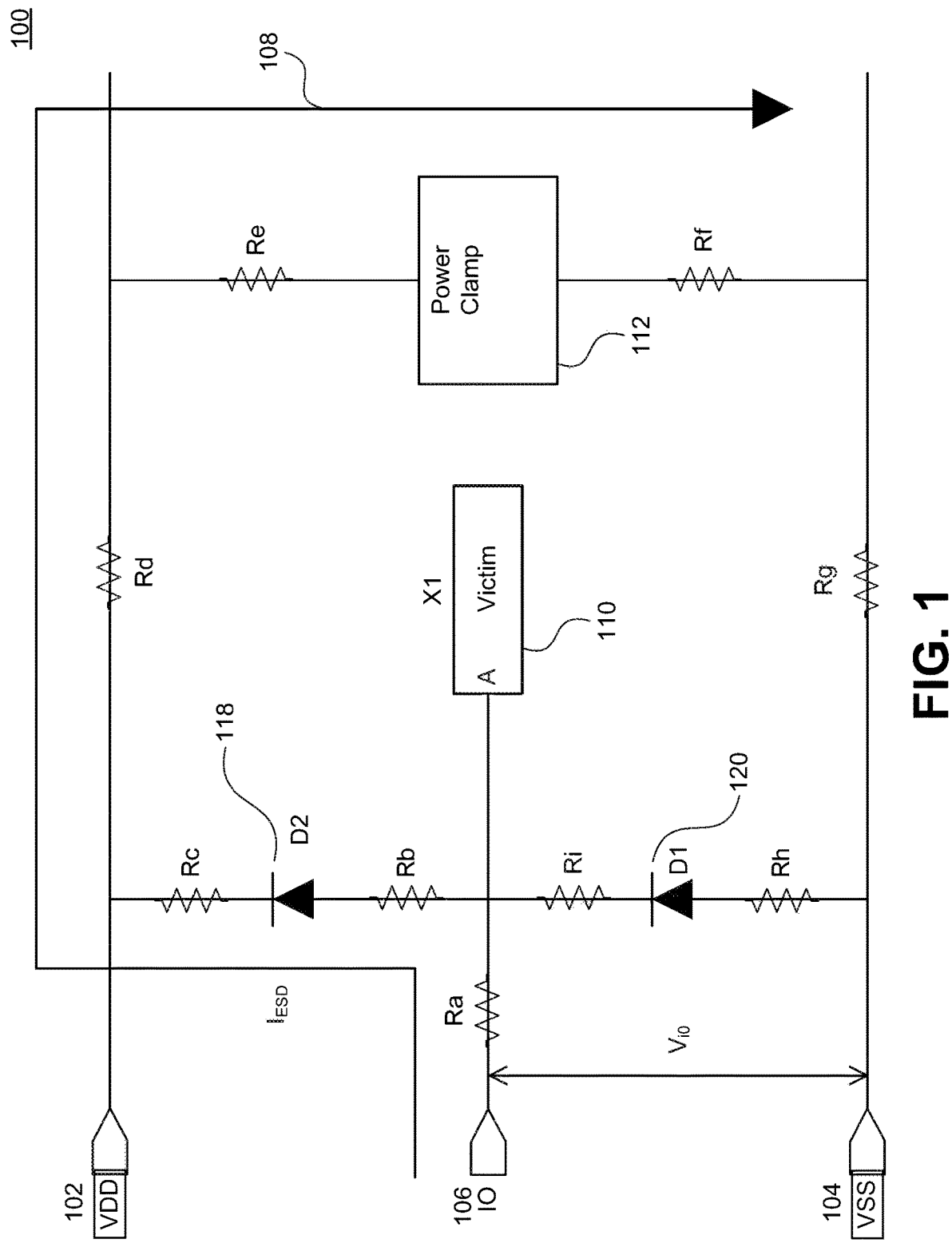
FIG. 1 illustrates an ESD path in an exemplary ESD protection circuit.

In such various figures, reference signs may be omitted as is consistent with accepted engineering practice; however, one of ordinary skill in the art will understand that the illustrated components are readily understood when viewed in the context of the illustration as a whole and the accompanying disclosure describing such various figures.

DETAILED DESCRIPTION

Aspects of the present disclosure relate to an automated method to check electrostatic discharge (ESD) effect on a victim device.

The present disclosure describes a method to automatically verify the effectiveness of ESD protection of devices in integrated circuits (ICs) with high accuracy. To evaluate effectiveness of an ESD protection schemes, ESD protection verification tools measure effective resistance between endpoints, such as source and sink, of an ESD path and compare the effective resistance to foundry-specified rules. Even though this method works well for most ESD protection criteria, it cannot accurately distinguish between portions of the ESD discharge path that contribute to the voltage built up across the victim devices and portions that do not contribute to the voltage build-up across the victim devices.

Foundries generally specify rules according to which portions of discharge paths that do not contribute to victim voltage can be discarded from the ESD effect on the victim device. But since currently available ESD protection verification tools cannot check them, false errors are produced. Consequently, ESD protection verification tools may use the full ESD path resistance, which may be easily computed, as an approximation to estimate the effective resistance seen by a victim device. Any errors introduced by the full ESD path resistance may be small and may not cause any problems in some scenarios. However, when inductors are used near a source point such as a pad JO, the error may be substantially large, resulting in undesirable results.

An IC designer may use manual methods to check the effective path resistance associated with the victim device. However, manual verification is not feasible since there may be thousands or tens of thousands of victim devices in a design. In addition, during final verification at an IP block or chip level, the manual method may not be practical since expert judgment and knowledge of the IC layout are required to confirm errors. Further, the full ESD path resistance, by definition, is higher than the effective path resistance, and hence, using full path resistance for ESD verification may result in violations for each input-output (I/O) pin of an IC.

The problem of accurately verifying the effectiveness of ESD protection without manual intervention can be solved by effective path resistance measurement methods disclosed herein. The present disclosure describes a method that can accurately check the effective path resistance associated with the victim device by identifying portions of the ESD discharge path that do not contribute to the voltage build-up across the victim device. This allows the foundry rules associated with one or more victim devices to be checked accurately and automatically, which may be much faster and more accurate than the current manual methods.

According to some aspects, the method provides the user the ability to specify one or more victim devices for analysis and calculate an effective resistance between a victim pin and an end point, as required by foundries. The method calculates an accurate effective resistance even when the victim pin is not on the current-carrying portion of the path. Further, according to some aspects, the method may compute and store node voltage at every point on an ESD path whether the current is flowing there or not. Accordingly, foundry rules regarding resistance from the victim device to a path endpoint may be checked accurately and effectively with no manual intervention.

FIG. 1 illustrates an ESD path in an exemplary ESD protection circuit design. By way of a non-limiting example, ESD protection circuit 100 is based on a double diode ESD protection scheme. The exemplary ESD protection circuit 100 employs a pull-up diode D2 118, pull-down diode D1 120, and a power clamp 112. The power clamp 112 is connected between a power bus VDD and ground bus VSS. During an ESD event, ESD current enters at pad IO 106, flows through the pull-up diode D2 118 and power clamp 112, and exists at ground pad VSS 104. The ESD path 108 is used for exemplary resistance analysis. Accordingly, in the ESD path 108 shown in FIG. 1, the pad IO 106 is the source, and the pad VSS 104 is the sink for the ESD current.

According to some aspects, an ESD path may begin at pad IO 106, connect through a cluster of ESD devices to one or more power clamping devices, and finally terminate at pad VSS 104. Further, according to some aspects, a single logical ESD path may devolve into multiple physical paths, each of them passing through a cluster of power clamping devices, and ending on a single power or ground pad, or grouped power or ground pads.

Further, in FIG. 1, an exemplary branch point is the point in the interconnect between pad IO 106, diodes D1 120 and D2 118, and the victim device X1 110. According to some aspects, a branch point can be a logical point comprising a clustering of multiple points in the interconnect of the circuit. Further, it may be difficult to automatically or manually identify a branch point in a circuit as the interconnect around a branch point is usually complex.

According to some aspects, the interconnect in the ESD path 108 is designed to carry the large current generated during an ESD event. To ensure that the ESD path 108 functions as intended, foundry rules may require the effective resistance of the discharge path to be kept low so that the ESD current flows via the discharge path having low resistance and not into core circuitry. High effective resistance of the ESD path 108 may prevent the ESD current from being diverted along the ESD path. As a result, the core circuitry could be left vulnerable to an ESD event.

According to some aspects, the effective resistance of the ESD path 108 may be represented by the combination of resistances offered by devices operating in a high current mode such as $R_{on-diode}$ and $R_{on-clamp}$, and parasitic resistances of the interconnect such as $R_a$, $R_b$, $R_c$, $R_d$, $R_e$, $R_f$, and $R_g$.

Accordingly, the effective resistance of the ESD path 108 $R_{path}$ may be represented as: $R_{path}=R_a+R_b+R_{on-diode}+R_c+R_d+R_e+R_{on-clamp}+R_f+R_g$.

Software tools for ESD verification may automatically compute this effective resistance and check the value against the foundry rules. The foundry may specify a target resistance value range to which the effective resistance may be compared to determine any violation for reporting to the user. While this check may be important for ensuring that the ESD current flows only where the interconnect is designed to carry it, the resistance $R_{path}$ may not be helpful in checking the ESD effect on a victim device X1 110 positioned at a location along the ESD path.

Figure 2:
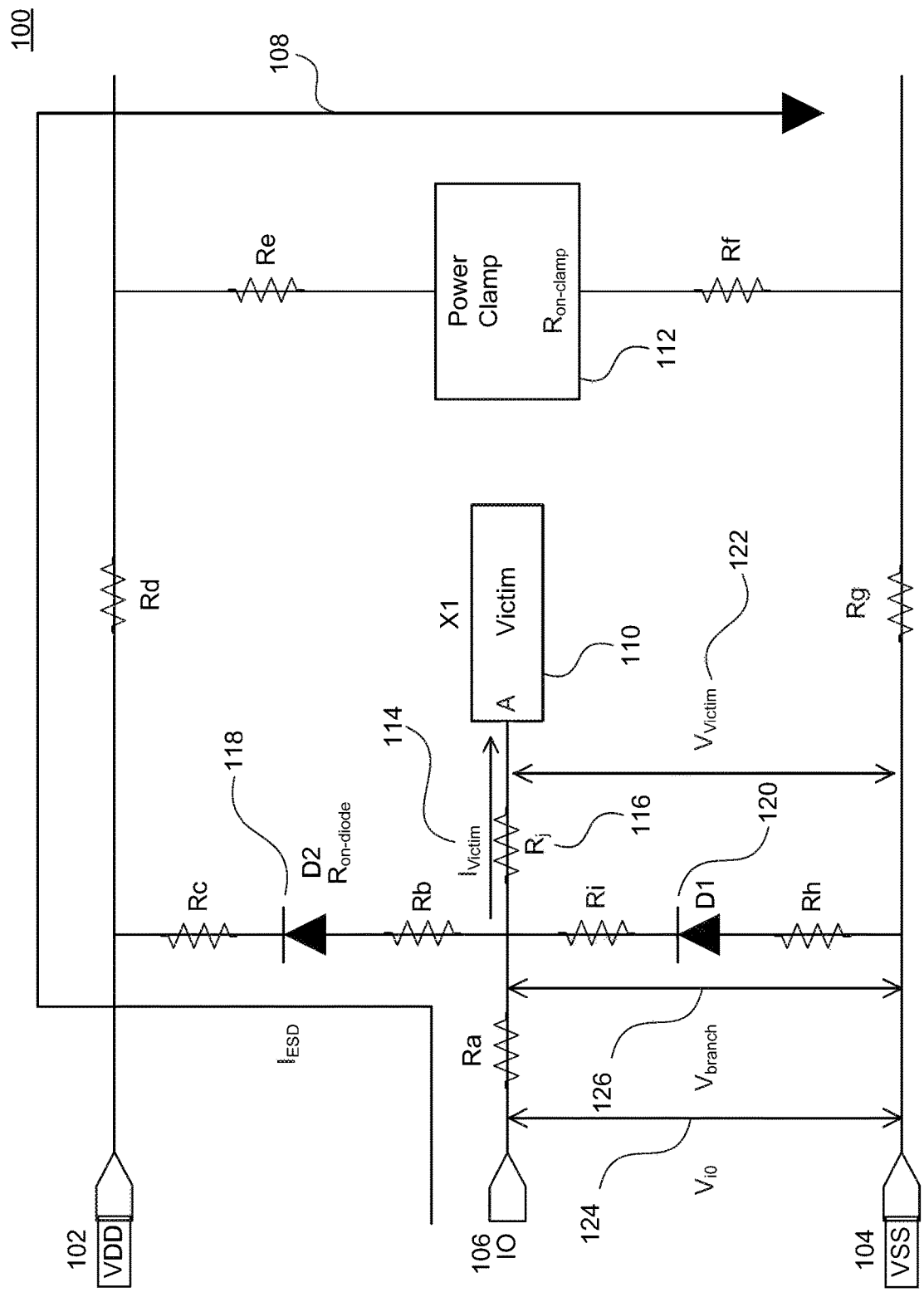
FIG. 2 illustrates an exemplary annotated ESD path, in accordance with some embodiments of the present disclosure.

FIG. 2 illustrates an exemplary annotated ESD path in the circuit design, according to some aspects of the disclosure. In the exemplary ESD protection circuit 100, $V_{Victim}$ is the voltage at the pin A of the victim device X1 110 and $V_{IO}$ is the voltage at pad IO 106. $V_{branch}$ 126 is the voltage at the branch point in this example.

According to some aspects, software tools for ESD verification may used a predefined electric current value at a source point and compute the node voltage $V_{IO}$ 124. According to some aspects, software tools for ESD verification may use a unit current for $I_{ESD}$ ($I_{ESD}=1.0$ Amps) and compute node voltage $V_{IO}$ 124 at source IO pad, and uses Ohm's law to compute $R_{path}$ as $R_{path}=V_{IO}/I_{ESD}=V_{IO}/1.0$. Accordingly, $R_{path}$ may have the same value as voltage $V_{IO}$.

According to some aspects, a critical parameter for ESD protection of the victim device X1 110 is the voltage $V_{Victim}$ 122. If the voltage $V_{Victim}$ exceeds the victim device's breakdown voltage during an ESD event, the device's structure may be destroyed, and the device may become non-functional. Since a fixed value of ESD current may be generally used for checking design robustness, foundry rules may use the effective resistance as seen from the victim device pin to a path endpoint, such as the ground, to ensure the device is well protected. If the effective resistance at the victim device is kept low enough, the voltage $V_{Victim}$ 122 may stay below the device's breakdown voltage.

According to some aspects, the effective resistance from the victim device pin to the ground may be related to $R_{path}$, but not equal to it. In addition, since currently available tools cannot automatically compute the correct resistance from the victim, $R_{path}$, if used, may lead to false errors and bad results, as described above.

According to some aspects, an accurate effective resistance from the victim device pin to the ground, $R_{victim}$, may be computed by taking advantage of node voltages that are measured at every point in the ESD path, including the voltage $V_{Victim}$ 122. Thus, $V_{Victim}$ may be used to compute or determine the effective resistance of a victim device.

During an ESD event, the current is diverted along the ESD path 108 away from the victim device. Accordingly, there will be no current flowing from the branch point to the victim device and $I_{Victim}$ 114 will equal zero Amps. Therefore, voltage across the victim device $v_{Victim}=V_{branch}-I_{Victim}*R_j=V_{branch}-0.0*R_j=V_{branch}$. Therefore, the voltage across the victim device $V_{Victim}$ may have the same value as the branch voltage $V_{branch}$ 126. Since the victim voltage may be equal to the branch voltage, as shown above, interconnect parasitic resistance $R_j$ 116 may not contribute to the victim device to endpoint resistance. Thus, the effective resistance to ground seen by the victim device is equal to the resistance to ground from the branch.

According to some aspects, the branch voltage $V_{branch}$ in the exemplary circuit may be represented as: $V_{branch}=V_{IO}-I_{ESD}*R_a$, where $V_{IO}$ is the voltage at pad IO 106, and without loss of generality, ESD current $I_{ESD}$ may be assumed to be 1 Amp. Accordingly, the branch voltage $V_{branch}$ may be further represented as: $V_{branch}=V_{IO}-I_{ESD}*R_a=R_{path}-R_a$.

Further, according to some aspects, the effective resistance from the victim device pin to the ground, $R_{victim}$, may be represented as: $R_{victim}=V_{Victim}/I_{ESD}$. Assuming a unit ESD current, $R_{victim}$ may be of the same value as $V_{Victim}$. Accordingly, since $V_{Victim}=V_{branch}$, effective resistance from the victim device may be obtained as: $R_{victim}=R_{path}-R_a$.

ESD protection verification tools currently provide the users the ability to specify an ESD path for checking the effective resistance by defining the end points, for example, source and sink points, and any devices included in the path. Accordingly, with reference to FIG. 2, such ESD path may include pad IO 106, diode D2 118, power clamp 112, and pad VSS 104. Exemplary pseudo-code for specifying an ESD path may be as follows:

```
add_current_path(
    sources = [ top_port_terminal(IO) ],
    sinks = [ top_port_terminal(VSS) ],
    device_paths = [
    device_current_path(D2, "ANODE", "CATHODE", R_on-diode),
    device_current_path(Power Clamp, "SRC", "DRN", R_on-clamp) ]
).
```

In the above exemplary pseudo-code, pad IO 106 and pad VSs 104 are specified as the source and the sink. The pull-up diode D2 118 in the ESD path is specified as having an ANODE and a CATHODE, with a resistance of $R_{on\text{-}diode}$. The power clamp 112 in the ESD path is specified as having a source SRC and a drain DRN with a resistance of $R_{on\text{-}clamp}$.

According to some aspects of the present disclosure, users can have the ability to check the effective resistance, $R_{victim}$, automatically by specifying additional points connected to nets in the ESD path as probe points. ESD protection verification tools can return the node voltage at the specified probe points. By way of a non-limiting example, the user may specify pin A of victim device X1 110 as a probe point to determine the node voltage $V_{Victim}$ 122, and accurately and automatically report the true $R_{Victim}$. The new pseudo-code to support probe points may be as follows:

```
add_current_path(
    ...
    probes = [ probe_point(pin_terminal("A"), "victim_pin_A") ] ),
```

In some embodiments, to retrieve the victim voltage after analysis, pseudo-code may be as shown below:

$$V_{Victim} = \text{probe\_voltage}(\text{"victim\_pin\_A"})$$

Thus, in some embodiments, the victim device may be identified or specified so that $V_{Victim}$ of the corresponding victim device may be stored and retrieved. In summary, the method described herein according to various embodiments may enable the software tools to compute all node voltages in an ESD path. Because ESD protection verification tools may use a unit current ($I_{ESD}=1.0$ A) for resistance analysis, based on Ohm's law, every node voltage in the analyzed path is equal to the effective resistance from that point to the endpoint, i.e., the sink point. Further, since the user can specify a probe point, it is possible to compare the effective resistance in the analyzed path between the probe point and the sink point with the maximum effective resistance specified by foundry rules. In the case where the effective resistance in the analyzed path between the probe point and the sink point is not in compliance with the foundry rules, an alert may be generated. By way of a non-limiting example, the alert may be displayed on a graphical user interface. Thus, compliance with foundry rules may be checked faster and accurately in comparison to manual methods. In some embodiments, the resistance value in the ESD path may be updated to enforce compliance with the foundry rule.

Figure 3:
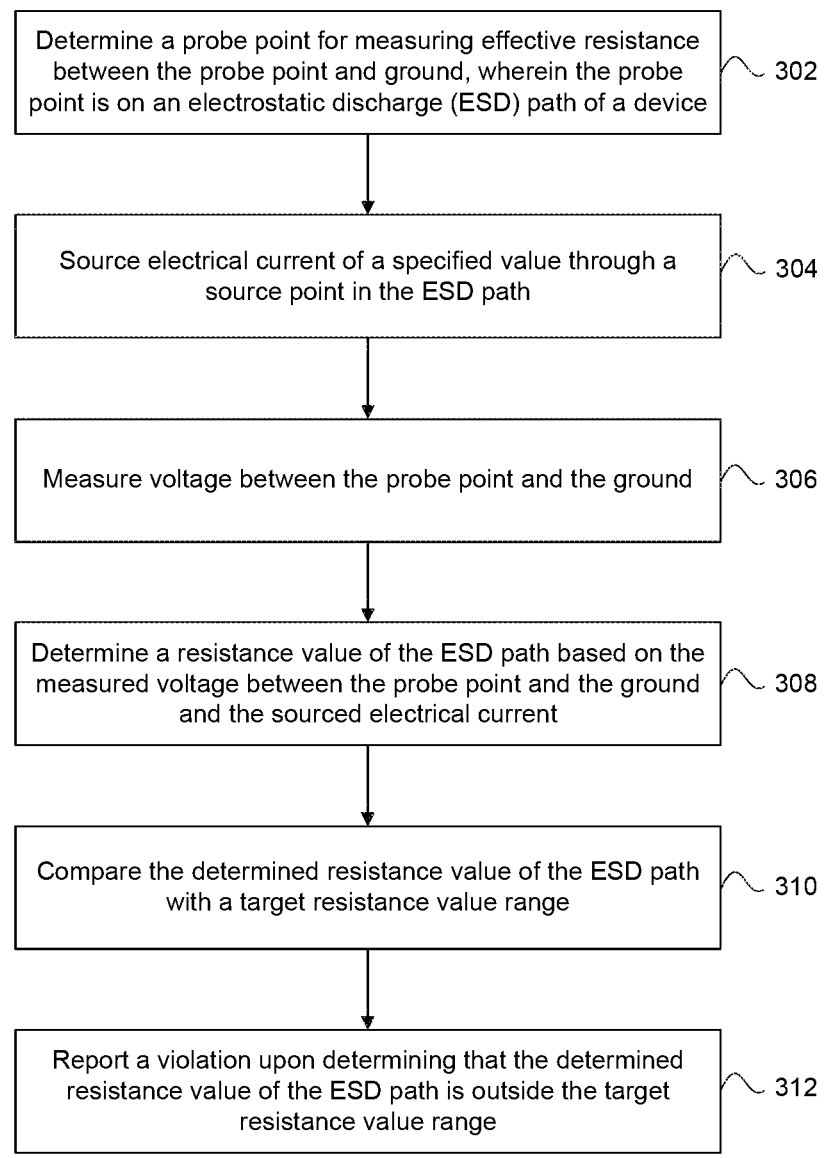
FIG. 3 illustrates an example method to check electrostatic discharge effect on a victim device, according to some aspects of the disclosure.

FIG. 3 illustrates an example method to check electrostatic discharge effect on a victim device, according to some aspects of the disclosure. FIG. 3 may be described with regard to elements of FIGS. 4-5. Method 300 may be performed by computer system 500 of FIG. 5. Method 300 may be performed on exemplary ESD protection circuits of FIGS. 1-2. Method 300 is not limited to the specific aspects depicted in those figures, and other systems may be used to perform the method as will be understood by those skilled in the art. It is to be appreciated that not all operations may be needed, and the operations may not be performed in the same order as shown in FIG. 3.

At 302, a user may determine a probe point for determining effective resistance between the probe point and the ground. According to some aspects, the probe point specified by the user may be located along an ESD path of a device. For example, the user may specify pin A of victim device X1 110 as a probe point. According to some embodiments, the user may specify additional points connected to nets in the path as probe points.

At 304, an electric current of a specified value is sourced through a source point in the ESD path. For example, without a loss of generality, ESD current $I_{ESD}$ may be assumed to be 1 Amp.

At 306, the voltage between the probe point and the ground is measured, according to some aspects. According to some aspects, the voltage at the probe point may have the same value as the voltage at a branch point on the ESD path. Hence, determining the voltage between at the probe point involves determining the voltage at the corresponding branch point. According to some embodiments, the branch point is the point where the device connects to the ESD path. According to some aspects, the branch point is a logical point in the circuit interconnect. According to some aspects, the voltage at the branch point is obtained by subtracting from the voltage value at the source point the voltage drop across a portion of the ESD path that does not contribute to the voltage at the probe point.

According to some aspects, when pin A of victim device X1 110 is specified as the probe point, the voltage at the probe point is given by $V_{Victim}=V_{branch}-I_{Victim}*R_j$. Assuming a unit current, the voltage at the probe point $V_{Victim}$ equals the voltage at the branch point $V_{branch}$. In the exemplary circuit in FIG. 2, the branch voltage $V_{branch}$ may be represented as: $V_{branch}=V_{IO}-I_{ESD}*R_a$, where $V_{IO}$ is the voltage at pad IO 106, and $I_{ESD}*R_a$ is the voltage drop across the resistor $R_a$. In this example, the portion of the ESD path that does not contribute to the voltage between the probe point and the ground is the portion with resistor $R_a$.

At 308, a resistance value of the ESD path is determined based on the measured voltage between the probe point and the ground and the sourced electric current. According to some aspects, the effective resistance of the ESD path between the probe point and the ground is determined based on Ohm's law. Accordingly, when pin A of victim device X1 110 is specified as the probe point, the resistance of the ESD path between the probe point and the ground is given by $R_{victim}=V_{Victim}/I_{ESD}$, where $V_{Victim}$ is the voltage at the probe point and $I_{ESD}$ is the ESD current.

At 310, the determined resistance value of the ESD path is compared with a target resistance value range. According to some aspects, when the resistance value exceeds the maximum value in the target resistance range, the ESD current may not be diverted along the ESD path, thereby damaging the core circuitry devices. According to some aspects, the foundry specifies the rules that provide a target resistance value range. According to some aspects, the effective resistance value of the ESD path between the probe point and the ground is compared with the target resistance value range to ensure that the ESD protection circuit functions as intended.

At 312, a violation is reported upon determining that the determined resistance value of the ESD path is outside the target resistance value range. According to some aspects, the interconnect is modified to update the effective resistance value to comply with the rule specified by the foundry.

Figure 4:
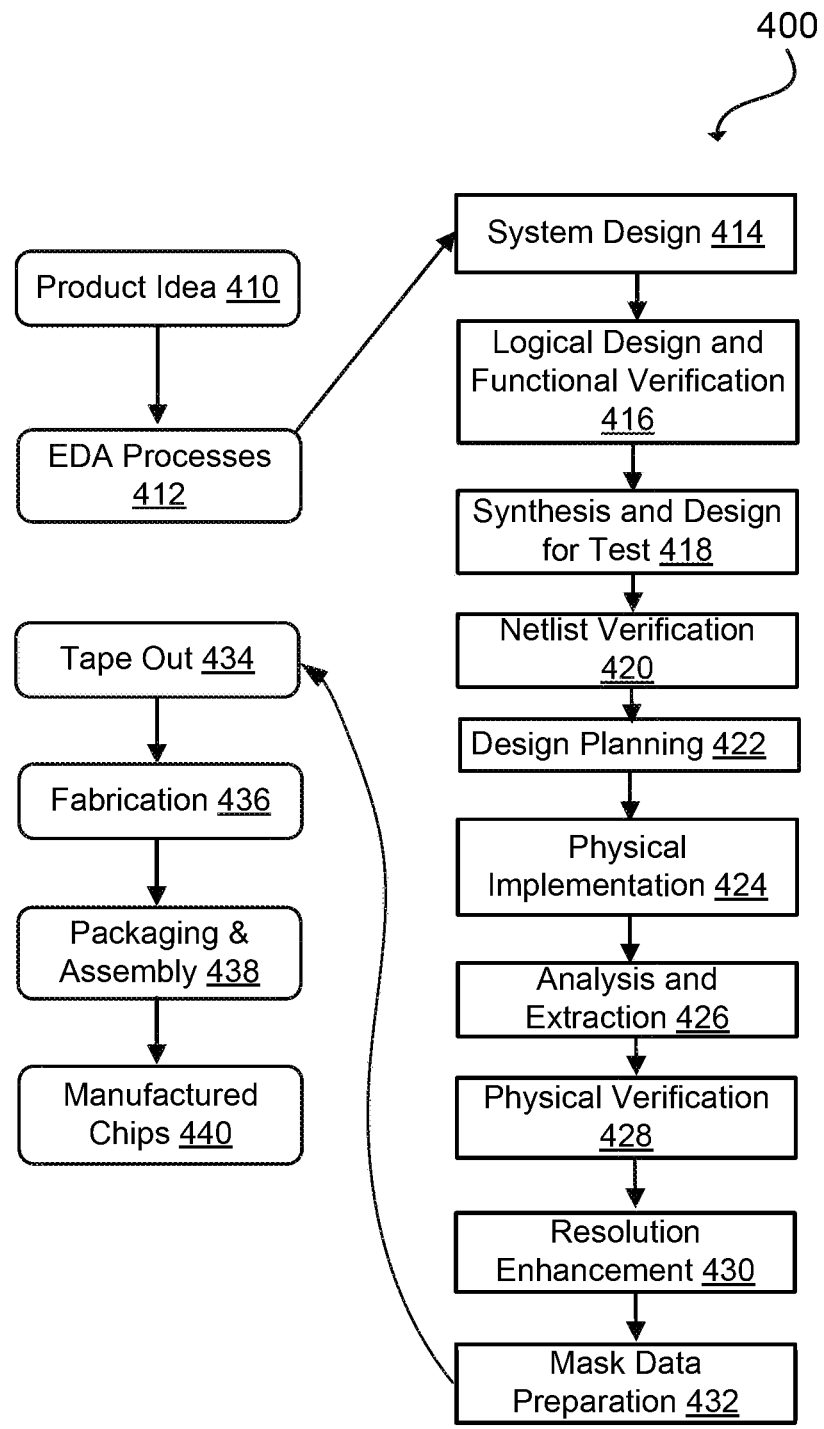
FIG. 4 illustrates a flowchart of various processes used during the design and fabrication of an integrated circuit, in accordance with some embodiments of the present disclosure.

FIG. 4 illustrates an exemplary method for ESD protection verification, according to some aspects of the disclosure.

FIG. 4 illustrates an example set of processes 400 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 410 with information supplied by a designer, information which is transformed to create an article of manufacture that uses a set of EDA processes 412. When the design is finalized, the design is taped-out 434, which is when artwork (e.g., geometric patterns) for the integrated circuit is sent to a fabrication facility to manufacture the mask set, which is then used to manufacture the integrated circuit. After tape-out, a semiconductor die is fabricated 436 and packaging and assembly processes 438 are performed to produce the finished integrated circuit 440.

Specifications for a circuit or electronic structure may range from low-level transistor material layouts to high-level description languages. A high-level of abstraction may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower abstraction level that is a less abstract description adds more useful detail into the design description, for example, more details for the modules that include the description. The lower levels of abstraction that are less abstract descriptions can be generated by a computer, derived from a design library, or created by another design automation process. An example of a specification language at a lower level of abstraction language for specifying more detailed descriptions is SPICE, which is used for detailed descriptions of circuits with many analog components. Descriptions at each level of abstraction are enabled for use by the corresponding tools of that layer (e.g., a formal verification tool). A design process may use a sequence depicted in FIG. 4. The processes described by be enabled by EDA products (or tools).

During system design 414, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 416, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 418, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 420, the netlist is checked for compliance with timing constraints and for correspondence with the HDL code. During design planning 422, an overall floor plan for the integrated circuit is constructed and analyzed for timing and top-level routing.

During layout or physical implementation 424, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 426, the circuit function is verified at the layout level, which permits refinement of the layout design. During physical verification 428, the layout design is checked to ensure that manufacturing constraints are correct, such as DRC constraints, electrical constraints, lithographic constraints, and that circuitry function matches the HDL design specification. During resolution enhancement 430, the geometry of the layout is transformed to improve how the circuit design is manufactured.

During tape-out, data is created to be used (after lithographic enhancements are applied if appropriate) for production of lithography masks. During mask data preparation 432, the 'tape-out' data is used to produce lithography masks that are used to produce finished integrated circuits.

A storage subsystem of a computer system (such as computer system 500 of FIG. 5) may be used to store the programs and data structures that are used by some or all of the EDA products described herein, and products used for development of cells for the library and for physical and logical design that use the library.

Figure 5:
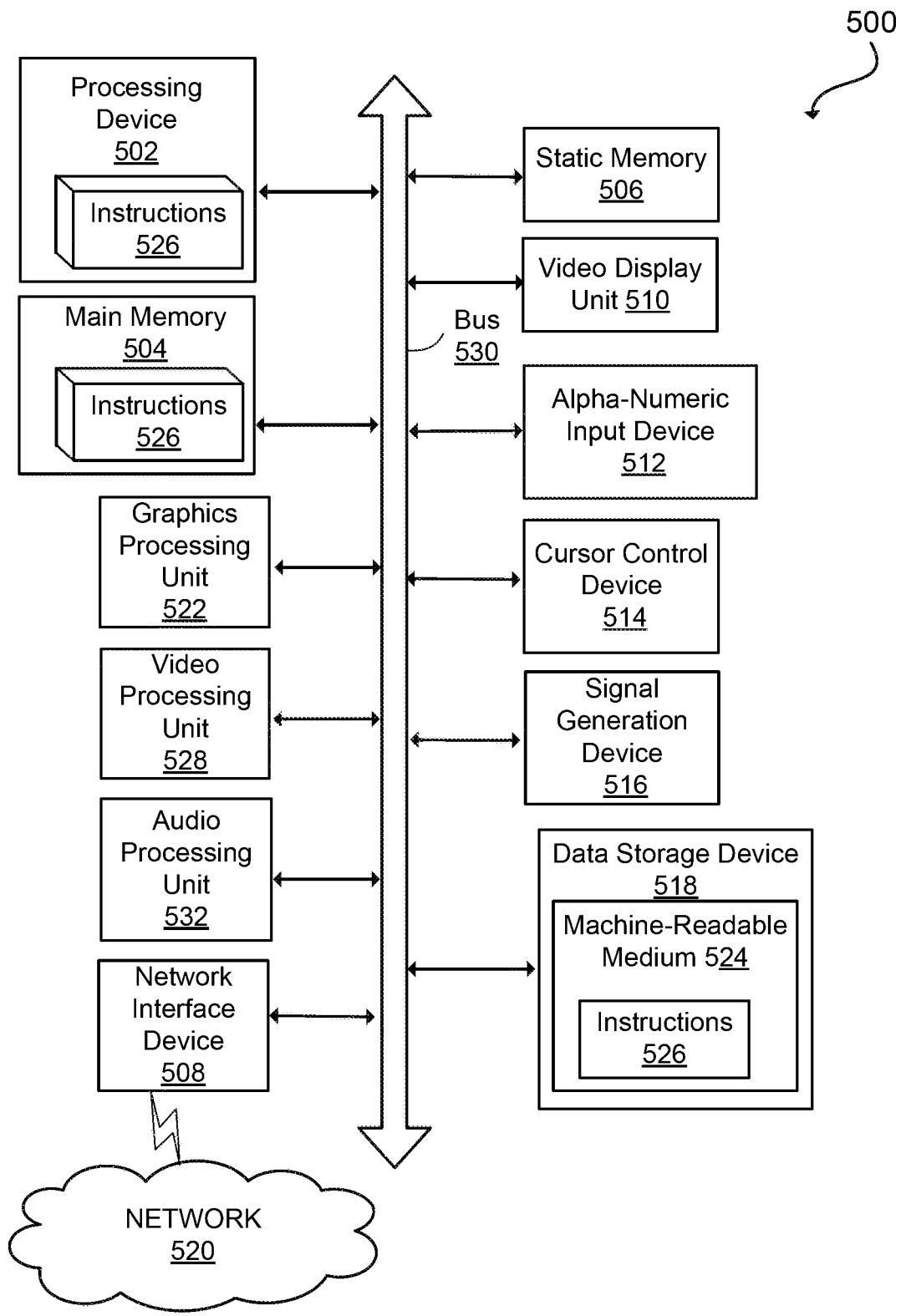
FIG. 5 illustrates an abstract diagram of an example computer system in which embodiments of the present disclosure may operate.

FIG. 5 illustrates an example machine of a computer system 500 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM), a static memory 506 (e.g., flash memory, static random access memory (SRAM), etc.), and a data storage device 518, which communicate with each other via a bus 530.

Processing device 502 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 may also be one or more special-purpose processing devices such as an application specific integrated circuit (ASIC), a field programmable gate array (FPGA), a digital signal processor (DSP), network processor, or the like. The processing device 502 may be configured to execute instructions 526 for performing the operations and steps described herein.

The computer system 500 may further include a network interface device 508 to communicate over the network 520. The computer system 500 also may include a video display unit 510 (e.g., a liquid crystal display (LCD) or a cathode ray tube (CRT)), an alphanumeric input device 512 (e.g., a keyboard), a cursor control device 514 (e.g., a mouse), a graphics processing unit 522, a signal generation device 516 (e.g., a speaker), graphics processing unit 522, video processing unit 528, and audio processing unit 532.

The data storage device 518 may include a machine-readable storage medium 524 (also known as a non-transitory computer-readable medium) on which is stored one or more sets of instructions 526 or software embodying any one or more of the methodologies or functions described herein. The instructions 526 may also reside, completely or at least partially, within the main memory 504 and/or within the processing device 502 during execution thereof by the computer system 500, the main memory 504 and the processing device 502 also constituting machine-readable storage media.

In some implementations, the instructions 526 include instructions to implement functionality corresponding to the present disclosure. While the machine-readable storage medium 524 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 502 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method for reporting a violation in a circuit design, the method comprising:
determining, by a processing device, a probe point in the circuit design, for determining effective resistance between the probe point and ground, wherein the probe point is on an electrostatic discharge (ESD) path in the circuit design;
determining voltage between the probe point and the ground;
comparing a resistance value of the ESD path determined based on a predefined electric current value at a source point and the measured voltage, with a target resistance value range; and
reporting, to a user, the violation of a victim device upon determining that the determined resistance value of the ESD path is outside the target resistance value range.

2. The method of claim 1, wherein determining the voltage between the probe point and the ground comprises:
determining voltage between the source point and the ground;
identifying a portion of a discharge path that does not contribute to the voltage between the probe point and the ground; and
subtracting voltage drop across the portion of the ESD path from the voltage between the source point and the ground.

3. The method of claim 1, wherein determining the voltage between the probe point and the ground further comprises determining voltage between a logical branch point and the ground, wherein the probe point is connected to the logical branch point.

4. The method of claim 3, wherein current flowing from the logical point to the probe point is zero during an ESD event.

5. The method of claim 1, wherein the target resistance value range is specified by a foundry rule.

6. The method of claim 1, further comprising updating the resistance value in the ESD path to comply with a foundry rule.

7. The method of claim 1, wherein the resistance value of the ESD path is calculate using Ohm's law.

8. A system for reporting a violation in a circuit design, the system comprising:
a memory storing instructions; and
a processor, coupled with the memory and to execute the instructions, the instructions when executed cause the processor to:
determine a probe point, in the circuit design, for determining effective resistance between the probe point and ground, wherein the probe point is on an electrostatic discharge (ESD) path in the circuit design;
determine voltage between the probe point and the ground;
compare a resistance value of the ESD path, determined based on a predefined electric current value at a source point and the measured voltage, with a target resistance value range; and
report, to a user, the violation of a victim device upon determining that the determined resistance value of the ESD path is outside the target resistance value range.

9. The system of claim 8, wherein executing the instructions further cause the processor to:
determine voltage between the source point and the ground;
identify a portion of a discharge path that does not contribute to the voltage between the probe point and the ground; and
subtract voltage drop across the portion of the ESD path from the voltage between the source point and the ground.

10. The system of claim 8, wherein executing the instructions further cause the processor to:
determine voltage between a logical branch point and the ground, wherein the probe point is connected to the logical branch point.

11. The system of claim 10, wherein current flowing from the logical branch point to the probe point is zero during an ESD event.

12. The system of claim 8, wherein the target resistance value range is specified by a foundry rule.

13. The system of claim 8, the instructions when executed further cause the processor to update the resistance value in the ESD path to comply with a foundry rule.

14. The system of claim 8, wherein the resistance value of the ESD path is calculate using Ohm's law.

15. A non-transitory computer-readable medium (CRM) having stored instructions, which when executed by a processor, cause the processor to perform operations comprising:
determining a probe point, in a circuit design, for determining effective resistance between the probe point and ground, wherein the probe point is on an electrostatic discharge (ESD) path in the circuit design;
sourcing electrical current through a source point in the ESD path;
determining voltage between the probe point and the ground;
comparing a resistance value of the ESD path, determined based on a predefined electric current value at a source point and the measured voltage, with a target resistance value range; and
reporting a violation upon determining that the determined resistance value of the ESD path is outside the target resistance value range.

16. The non-transitory CRM of claim 15, wherein determining the voltage between the probe point and the ground comprises:
determining voltage between the source point and the ground;
identifying a portion of a discharge path that does not contribute to the voltage between the probe point and the ground; and
subtracting voltage drop across the portion of the ESD path from the voltage between the source point and the ground.

17. The non-transitory CRM of claim 15, wherein determining the voltage between the probe point and the ground further comprises determining voltage between a logical branch point and the ground, wherein the probe point is connected to the logical branch point.

18. The non-transitory CRM of claim 17, wherein current flowing from the logical point to the probe point is zero during an ESD event.

19. The non-transitory CRM of claim 15, wherein the target resistance value range is specified by a foundry rule.

20. The non-transitory CRM of claim 15, wherein the stored instructions, which when executed by the processor, further cause the processor to update the resistance value in the ESD path to comply with a foundry rule.

* * * * *